(12) United States Patent  
Park

(10) Patent No.: US 7,145,814 B2  
(45) Date of Patent: Dec. 5, 2006

(54) RAS TIME CONTROL CIRCUIT AND METHOD FOR USE IN DRAM USING EXTERNAL CLOCK

(75) Inventor: Jung-Hoon Park, Ichon-shi (KR)

(73) Assignee: Hynix Semiconductor, Inc., Kyoungki-Do (KR)

( * ) Notice: Subject to any disclaimer, the term of this patent is extended or adjusted under 35 U.S.C. 154(b) by 14 days.

(21) Appl. No.: 11/024,984

(22) Filed: Dec. 30, 2004

(65) Prior Publication Data

US 2005/0237827 A1 Oct. 27, 2005

(30) Foreign Application Priority Data

Apr. 22, 2004 (KR) .................. 10-2004-0027914

(51) Int. Cl.
*G11C 7/00* (2006.01)
(52) U.S. Cl. ...................... 365/193; 365/236
(58) Field of Classification Search ................ 365/193, 365/236
See application file for complete search history.

(56) References Cited

U.S. PATENT DOCUMENTS

| 4,934,826 | A | * | 6/1990 | Miyatake et al. ........... 365/222 |
| 5,157,630 | A | | 10/1992 | Suwa et al. |
| 5,268,865 | A | * | 12/1993 | Takasugi ................ 365/189.05 |
| 5,311,483 | A | * | 5/1994 | Takasugi ..................... 365/233 |
| 5,384,745 | A | * | 1/1995 | Konishi et al. ........ 365/230.03 |
| 5,530,944 | A | | 6/1996 | Stones |
| 6,108,252 | A | | 8/2000 | Park |
| 6,215,709 | B1 | * | 4/2001 | Wright et al. .......... 365/189.11 |
| 6,246,614 | B1 | * | 6/2001 | Ooishi ........................ 365/191 |
| 6,343,043 | B1 | * | 1/2002 | Kai et al. .................... 365/222 |
| 2002/0003747 | A1 | * | 1/2002 | Yahata et al. ................ 365/233 |

FOREIGN PATENT DOCUMENTS

| JP | 2003-168292 A | 6/2003 |
| JP | 2003-297082 A | 10/2003 |
| KR | 1999-020992 | 3/1999 |

\* cited by examiner

*Primary Examiner*—Michael Tran
(74) *Attorney, Agent, or Firm*—McDermott Will & Emery LLP

(57) ABSTRACT

There is provided a RAS time control circuit for use in a semiconductor memory device. The RAS time control circuit includes a counter for counting the number of external clocks, a comparator for comparing the counted clock number with a preset comparison reference value, a RAS controller for determining a delay time of an internal RAS signal from the comparison result of the comparator, and an internal RAS generator for maintaining an internal RAS signal according to an instruction of the RAS controller.

27 Claims, 11 Drawing Sheets

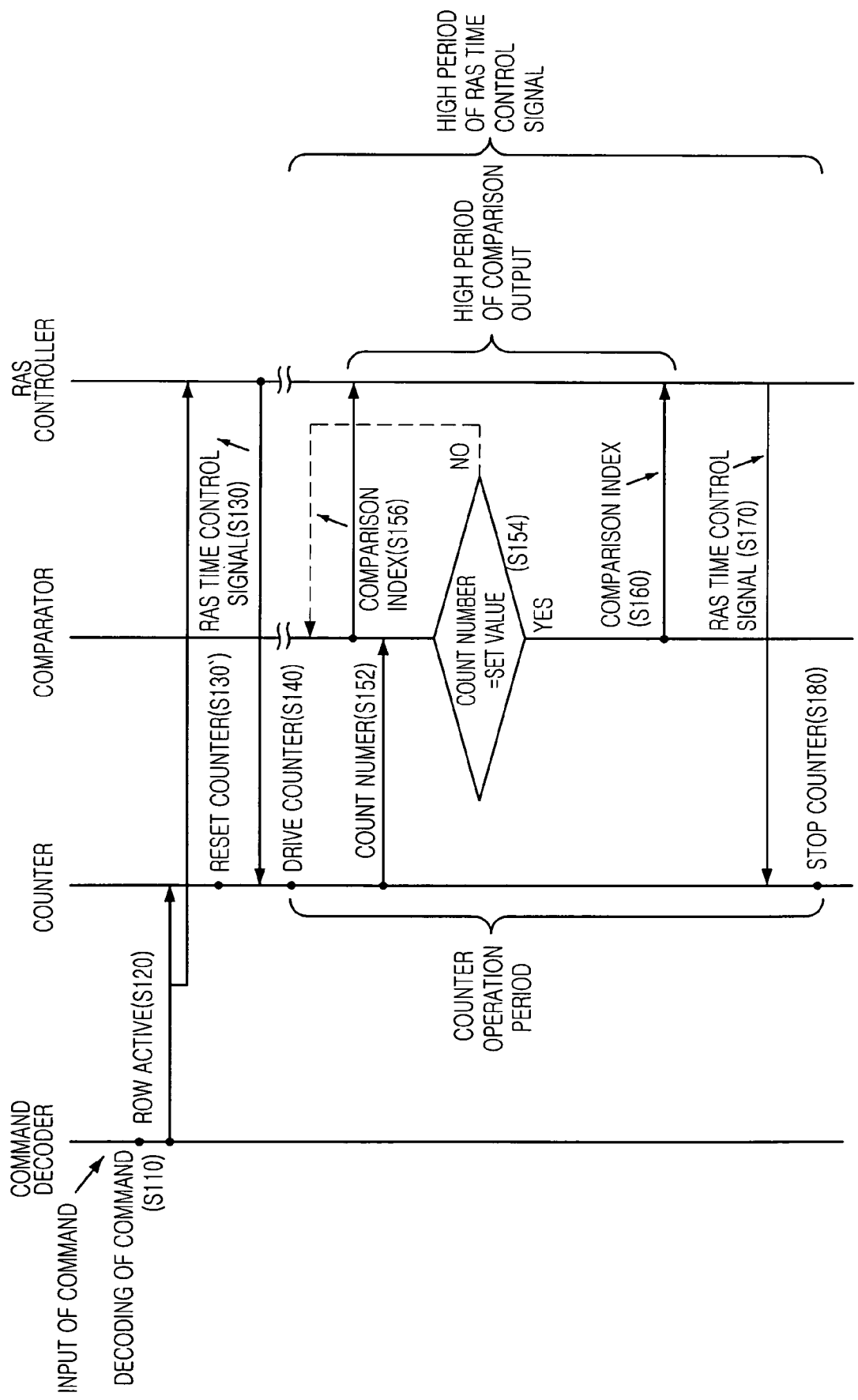

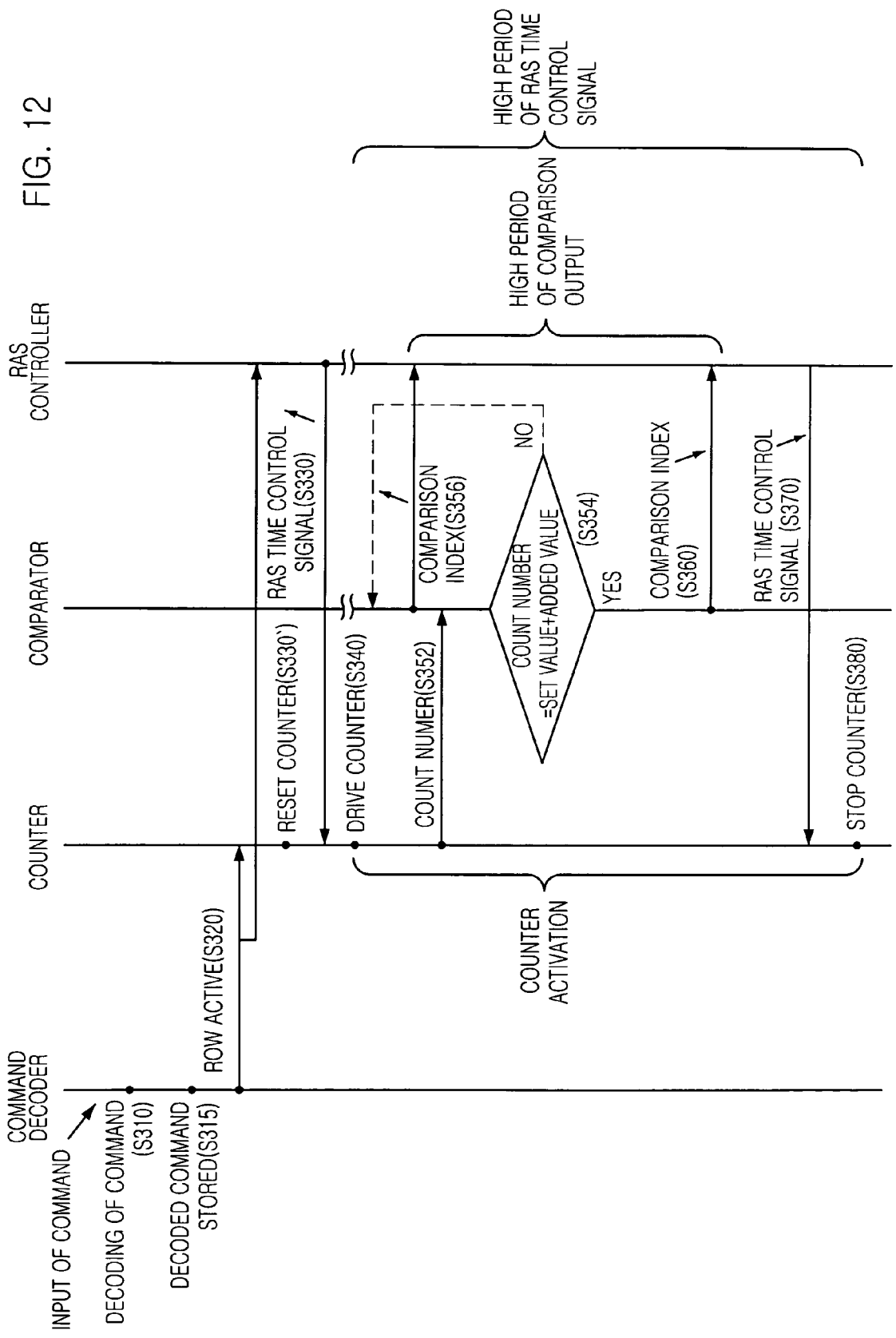

RAS TIME CONTROL CIRCUIT AND METHOD FOR USE IN DRAM USING EXTERNAL CLOCK

FIELD OF THE INVENTION

The present invention relates to a circuit for stabilizing a minimum delay time (tRASmin) of a RAS signal of a DRAM by using an external clock; and, more particularly, to a circuit and method for controlling a minimum delay time of an internal RAS signal of a DRAM by using a clock counter and a comparator.

DESCRIPTION OF RELATED ART

A dynamic random access memory (hereinafter, referred to as a DRAM) is a volatile memory device of which memory cell consists of one transistor and one capacitor. Charges stored in a cell capacitor are transferred as a leakage current through a storage node, resulting in breaking a data "1". Therefore, a refresh operation must be periodically performed so as to retain a data stored in a memory cell.

The DRAM receives an address from an external circuit in a read/write operation. At this point, since the address is separately inputted as a row address and a column address, the number of I/O pins is decreased and a control efficiency is increased.

In a refresh/read/write operation, data of all memory cells connected to a word line corresponding to a row address strobe (RAS) signal that identifies a row address are activated. Then, a column address strobe (CAS) signal is activated to refresh a memory cell corresponding to the column address or to read/write data.

However, due to storage capacitor characteristics such as a relatively low speed and a requirement of a re-charge, a predetermined time interval is required between a certain operation and a next operation in order for a reliable operation of the DRAM. That is, the RAS signal must be maintained for a sufficient time. If the RAS signal for the next operation is inputted before the previous operation is completed, an erroneous operation may occur. A time characteristic value for that is a RAS time (tRAS). The RAS time (tRAS) means a time duration while a RAS signal is being activated at a low level. A minimum RAS time required in a read with auto precharge operation or an auto refresh operation or a self refresh operation is called a minimum RAS time (tRASmin).

In order to secure the minimum RAS time (tRASmin), there is provided a circuit (tRAS Lock circuit) for sufficiently maintaining a RAS signal inputted from an external circuit in an inside of the DRAM chip. The circuit sufficiently maintains an internal RAS signal, which is used in the inside of the DRAM regardless of an actual delay time of an external RAS, as much as the minimum RAS time (tRASmin). In a conventional system, a delay circuit configured with an inverter and a capacitor has been used.

However, characteristic values of the inverter and the capacitor contained in the conventional RAS delay circuit are changed depending on an external environment, such as temperature or humidity. Thus, there is a problem in that a delay time is seriously changed.

Also, in the conventional RAS delay circuit, the same minimum RAS time (tRASmin) is applied in the respective operations of the DRAM. While the read with auto precharge operation has only to activate one bank, the auto refresh operation or the self refresh operation must activate all banks. Thus, a voltage of a word line becomes stronger. In this case, if the same minimum RAS time (tRASmin) is used, a sensing margin of a sense amplifier is degraded in the refresh operation.

SUMMARY OF THE INVENTION

It is, therefore, an object of the present invention to provide a RAS time control circuit and method, which are capable of constantly maintaining a delay time of a RAS time by using an external clock.

It is another object of the present invention to provide a RAS time control circuit and method, in which a RAS time can be controlled using a delay circuit consisting of an inverter and a capacitor even when an external clock is not inputted.

It is a further another object of the present invention to provide a RAS time control circuit and method, in which a different RAS time can be applied depending on the kinds of the command.

In accordance with an aspect of the present invention, there is provided a RAS time control circuit for use in a semiconductor memory device, including: a counter for counting the number of external clocks; a comparator for comparing the counted clock number with a preset comparison reference value; a RAS controller for determining a delay time of an internal RAS signal from the comparison result of the comparator; and an internal RAS generator for maintaining an internal RAS signal according to an instruction of the RAS controller.

In accordance with another aspect of the present invention, there is provided a RAS time control circuit for use in a semiconductor memory device, including: a command decoder for decoding an external signal; a counter for counting the number of external clocks; a comparator for comparing the counted clock number with a preset comparison reference value; a RAS controller for determining a delay time of an internal RAS signal from the comparison result of the comparator; an internal RAS generator for maintaining an internal RAS signal according to an instruction of the RAS controller; and a legacy delay part for determining a delay time of the internal RAS signal when the decoded signal is a self refresh.

BRIEF DESCRIPTION OF THE DRAWINGS

The above and other objects and features of the instant invention will become apparent from the following description of preferred embodiments taken in conjunction with the accompanying drawings, in which:

FIG. 11 is a flowchart illustrating a RAS time control of the RAS time control circuit in accordance with the first embodiment of the present invention; and FIG. 12 is a flowchart illustrating a RAS time control of the RAS time control circuit in accordance with the third embodiment of the present invention.

DETAILED DESCRIPTION OF THE INVENTION

Hereinafter, the present invention will be described in detail with reference to the accompanying drawings.

Figure 1:
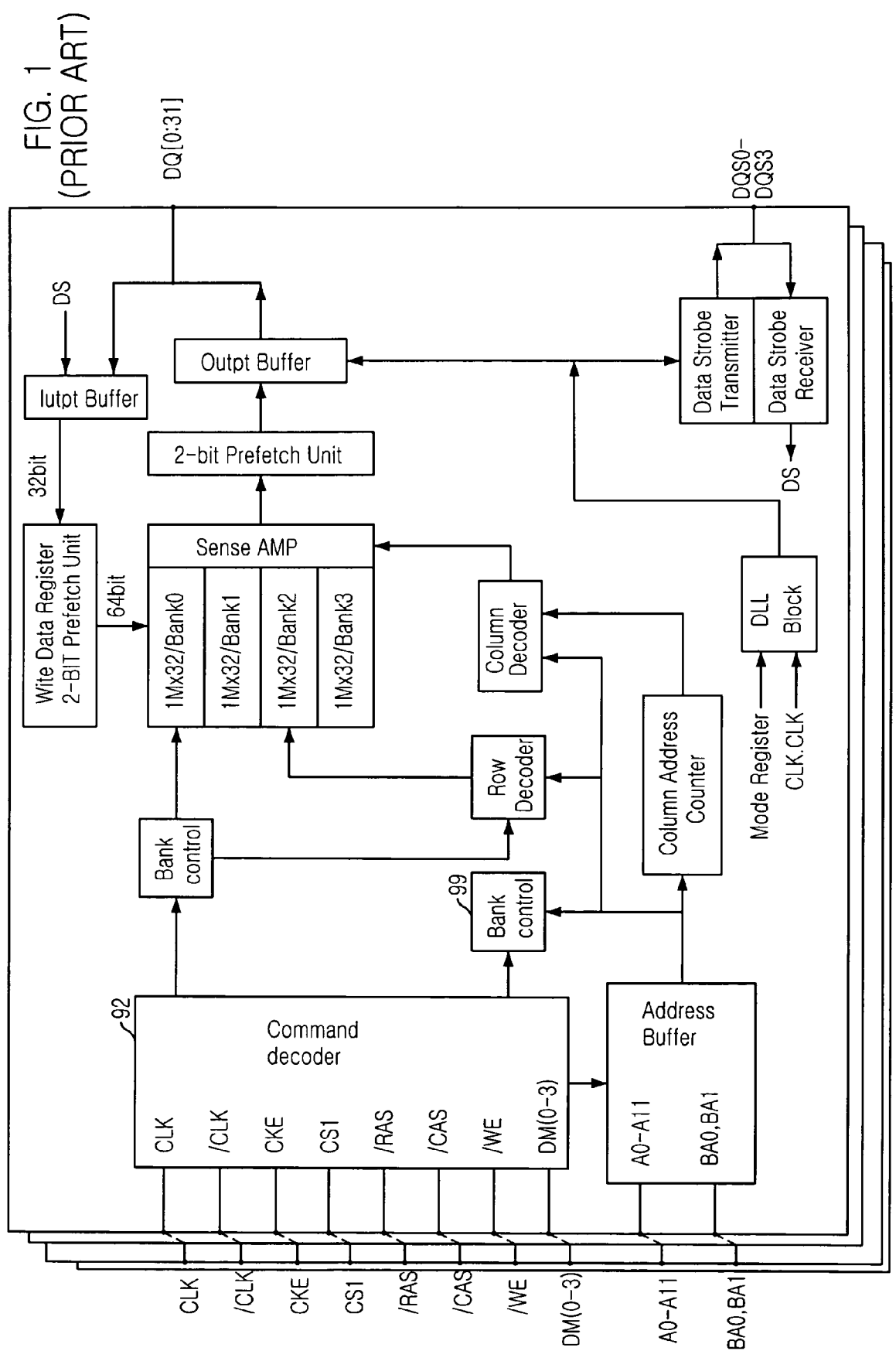
FIG. 1 is a block diagram of a DRAM.

FIG. 1 is a diagram illustrating functional blocks of a DRAM.

Referring to FIG. 1, an input block of the DRAM includes an address buffer, a data input buffer, and a command decoder 92. Among them, the command decoder 92 decodes various command signals inputted from an external circuit, converts them into signals having appropriate levels for an internal memory bank, and performs a required control operation.

A control circuit in accordance with a preferred embodiment of the present invention may be implemented with the command decoder 92 and a mode register set 99. Also, a minimum RAS time (tRASmin) is secured by a RAS time control signal (tRASmin_clk).

Embodiment 1

A RAS time control circuit in accordance with a first embodiment of the present invention will be described below with reference to FIG. 2.

The RAS time control circuit includes a command decoder 17 for decoding an external signal, a counter 14 for counting the number of clocks inputted from an external circuit, a comparator 13 for comparing the counted clock number with a preset comparison reference value, a RAS controller 12 for determining a delay time of an internal RAS signal int.RAS from the comparison result of the comparator 13, and an internal RAS generator 16 for maintaining the internal RAS signal int.RAS according to an instruction of the RAS controller 12.

Preferably, the RAS time control circuit may further include a mode register 19 for recording the comparison reference value set from an outside of the memory device. Here, the comparison reference value is a clock number required in securing the minimum RAS time (tRASmin).

In this embodiment, a RAS time control signal tRASmin_clk is a high enable signal and the internal RAS signal int.RAS is enabled while the RAS time control signal tRASmin_clk is in an enabled state. The internal RAS signal int.RAS is a low enable signal. The comparison result of the comparator 13 is a high section when the counter 14 is operated and generates a comparison index signal comp falling when both comparison values are identical to each other.

Although the present invention is not limit to this, the comparison reference value of the comparator 13 can be designated in the mode register 19. For example, it is preferable that a storage space for the comparison reference value is further included in the mode register set of the conventional DRAM. The comparison reference value designated in the mode register 19 is determined by comparing a delay time of a preferable RAS signal with a period of an external clock. A memory control chipset (or CPU) of an outside of the DRAM can set an appropriate reference value depending on a system clock.

The command decoder 17 receives external signals /RAS, /CAS, CS and /WE from an outside of the DRAM chip and decodes commands contained in the signals based on a DRAM specification, and then outputs a row active pulse ratvzp13. In an actual implementation, the command decoder can issue only the command for generating the row active pulse ratvzp13 and other elements for outputting the row active pulse ratvzp13 can be provided. However, for the convenience of explanation, they are included in the command decoder 17. The row active pulse ratvzp13 is a start signal for a specific operation of the counter 14 and the RAS controller 12.

The counter 14 counts the number of clocks inputted from an external circuit. In one embodiment, the external clock may use a clock supplied for a synchronization of a synchronous DRAM. An output of the counter 14 is connected to the comparator 13 and the clock number counted according to the input of the clocks continues to be outputted to the comparator 13. The counter 14 can be reset at a time point when the RAS time control signal tRASmin_clk or the internal RAS signal int.RAS is enabled. Alternatively, like this embodiment, it is preferable to reset the counter 14 according to the generation of the row active pulse ratvzp13.

Figure 6:
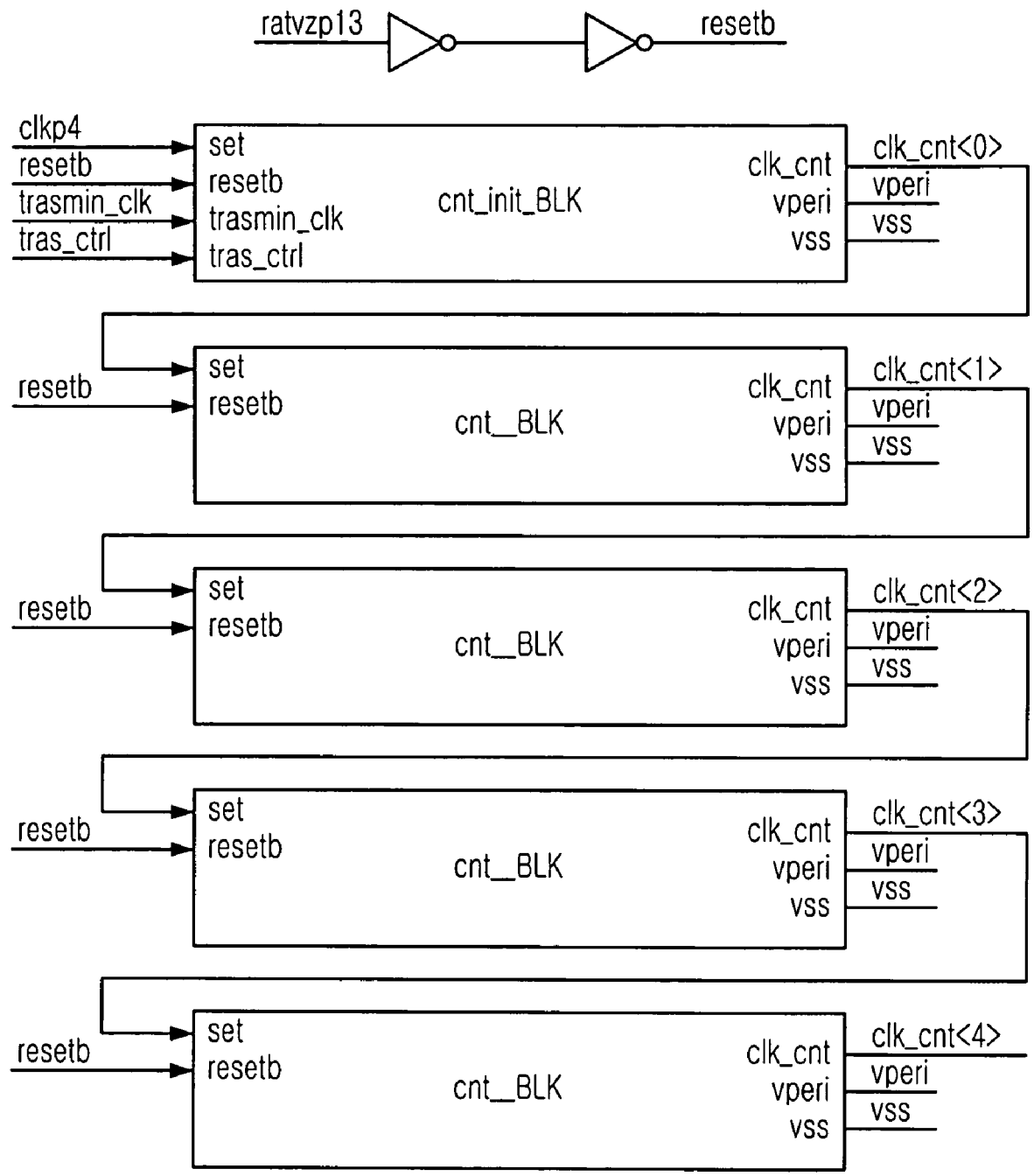
FIG. 6 is a diagram illustrating an internal structure of a counter in accordance with an embodiment of the present invention.
Figure 8:
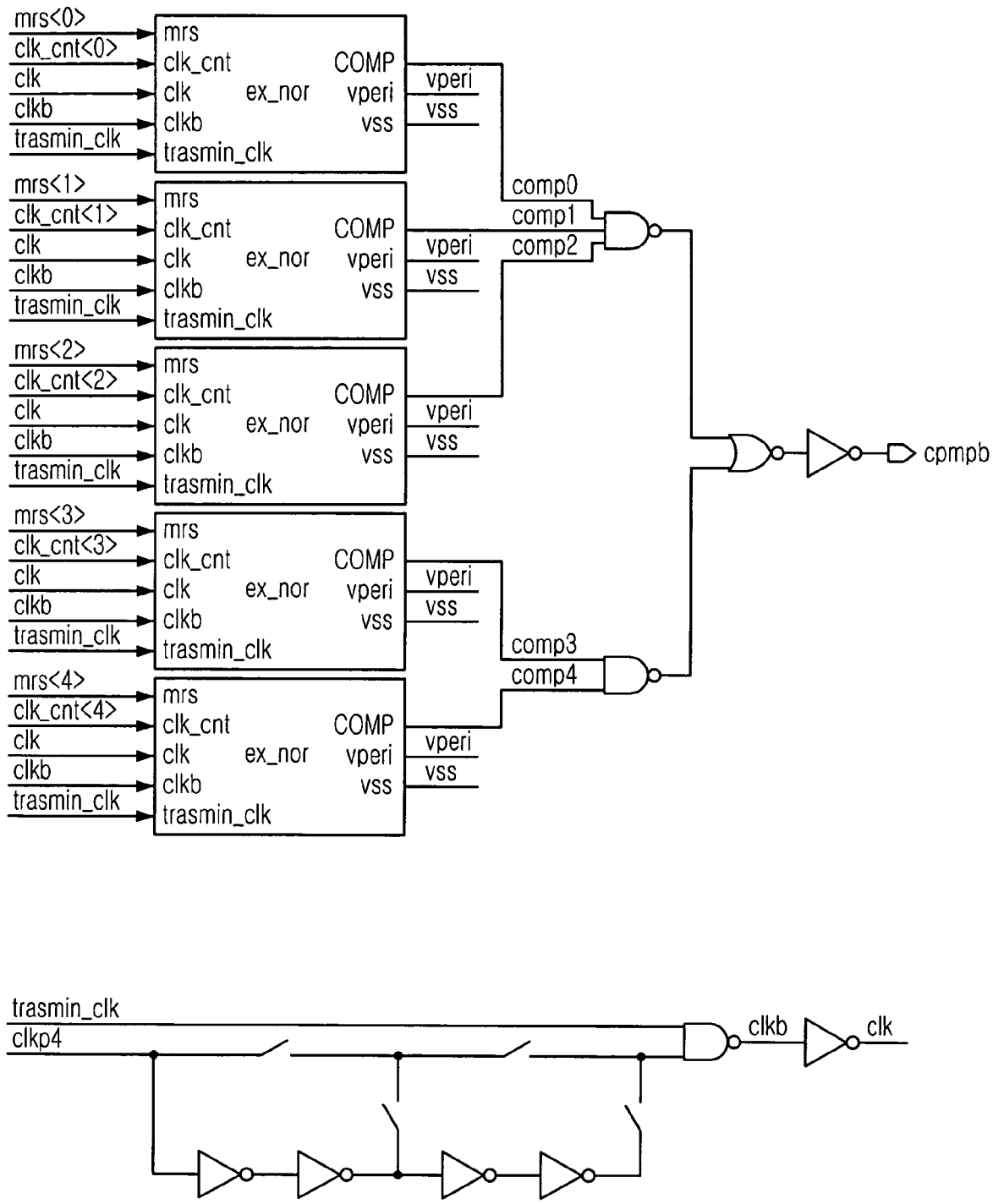
FIG. 8 is a diagram illustrating an internal structure of a comparator in accordance with an embodiment of the present invention.

In one embodiment, as shown in FIGS. 6 and 8, the output of the counter 14 can be connected to the comparator in a form of bus, which is a set of bit outputs with respect to the set values of respective flip-flops configuring the counter. As shown in FIG. 8, the comparison reference values of the mode register can also be connected to the comparator in a form of bus, which is a set of bit outputs. The comparator shown in FIG. 8 includes bit comparators ex_nor for comparing the output bits of the counter with the respective bits of the mode registers, based on the respective digits. The bit comparators ex_nor are provided as many as the digits. When all the bit comparators ex_nor output the same signals, they output the comparator index compb notifying that the comparison values are identical to each other.

That is, the comparator 13 compares the counted clock number inputted from the counter 14 with the comparison reference values recorded in the mode register 19. If the clock number is identical to the comparison reference value, that the RAS time period is maintained sufficiently is notified through the comparison index comp to the RAS controller 12. In FIG. 8, the output of the comparison index comp is latched, so that a previous output value is continuously maintained until a next comparison result. If the counted clock number is different from the comparison reference value, a final comparison index comp has a high level. On the contrary, if the counted clock number is identical to the comparison reference value, the final comparison index comp falls. In some cases, an opposite operation is also possible.

The RAS controller 12 outputs the RAS time control signal tRASmin_clk to the internal RAS generator 16. The RAS time control signal tRASmin_clk is changed to a high level when the row active pulse is inputted. Meanwhile, the RAS time control signal tRASmin_clk is changed to a low level when the comparison index comp is changed to a low level.

Figure 7:
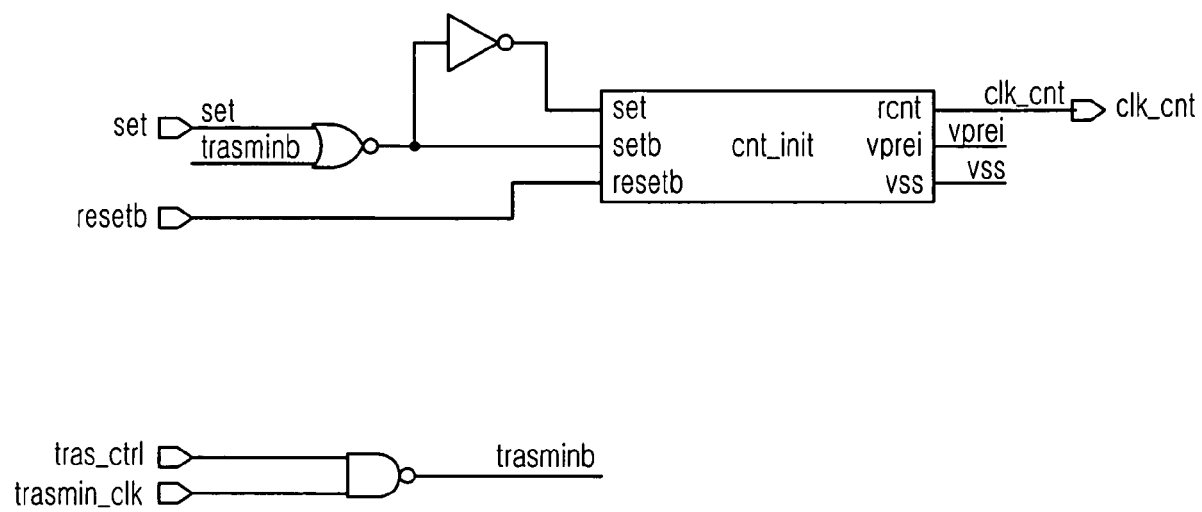
FIG. 7 is a circuit diagram illustrating an input stage of a counter in accordance with an embodiment of the present invention.

Also, as shown in FIG. 7, the RAS time control signal tRASmin_clk can be inputted to an input block cnt_init_BLK of the counter as a signal for controlling the operation of the counter 14. As shown in FIG. 8, the RAS time control signal tRASmin_clk can be inputted as a signal for controlling the operation of the respective bit comparators ex_nor of the comparator. In this case, the counter 14 and the comparator 13 performs the operation only during an enable period of the RAS time control signal tRASmin_clk and stops the operation during a disable period of the RAS time control signal tRASmin_clk. If the counter 14 stops, the comparator 13 also stops. Therefore, if necessary, the connection of the RAS time control signal tRASmin_clk inputted to the respective bit comparators ex_nor can be omitted, which is illustrated in FIG. 2.

The internal RAS generator 16 receives the RAS time control signal tRASmin_clk from the RAS controller 12 and enables the internal RAS signal int.RAS while the RAS time control signal tRASmin_clk is in a high level.

A RAS time control method applied to the RAS time control circuit in accordance with the first embodiment of the present invention will be described below with reference to FIG. 11.

In step S110, the command decoder 17 decodes the command inputted from an outside of the DRAM. In step S120, the command decoder 17 generates the row active pulse ratvzp13 to the counter 14 and the RAS controller 12. In step S130, the counter 14 is reset in response to the row active pulse ratvzp13, and the RAS controller 12 enables the RAS time control signal tRASmin_clk transferred to the counter 14. In step S140, the counter 14 starts to operate in response to the transition of the RAS time control signal tRASmin_clk. In step S150, the comparator 13 receives the count number from the counter 14 and compares the count number with the preset comparison reference value. If the count number is different from the comparison reference value, the comparison index comp is repetitively changed and maintained to a high level. In step S160, if the count number is identical to the comparison reference value, the comparator 13 changes the comparison index comp to a low level. In step S170, the RAS controller 12 receives the high-to-low transition of the comparison index comp and changes the RAS time control signal tRASmin_clk to a low level. In step S180, the counter 14 receives the high-to-low transition of the RAS time control signal tRASmin_clk and stops its operation.

Assuming that a synchronous clock inputted from an outside of the DRAM is 100 MHz, a period of the clock inputted to the counter 14 is 10 nsec. Also, assuming that the minimum RAS time tRASmin required in a DDR RAM is about 50 nsec, a sufficient RAS time tRAS is about five clock periods. For this purpose, the step of setting a mode register is performed prior to the above steps. That is, if the CPU or chipset requests to set the comparison value to "5", "5" is recorded as the comparison reference value in the mode register 19 of the DRAM.

Figure 2:
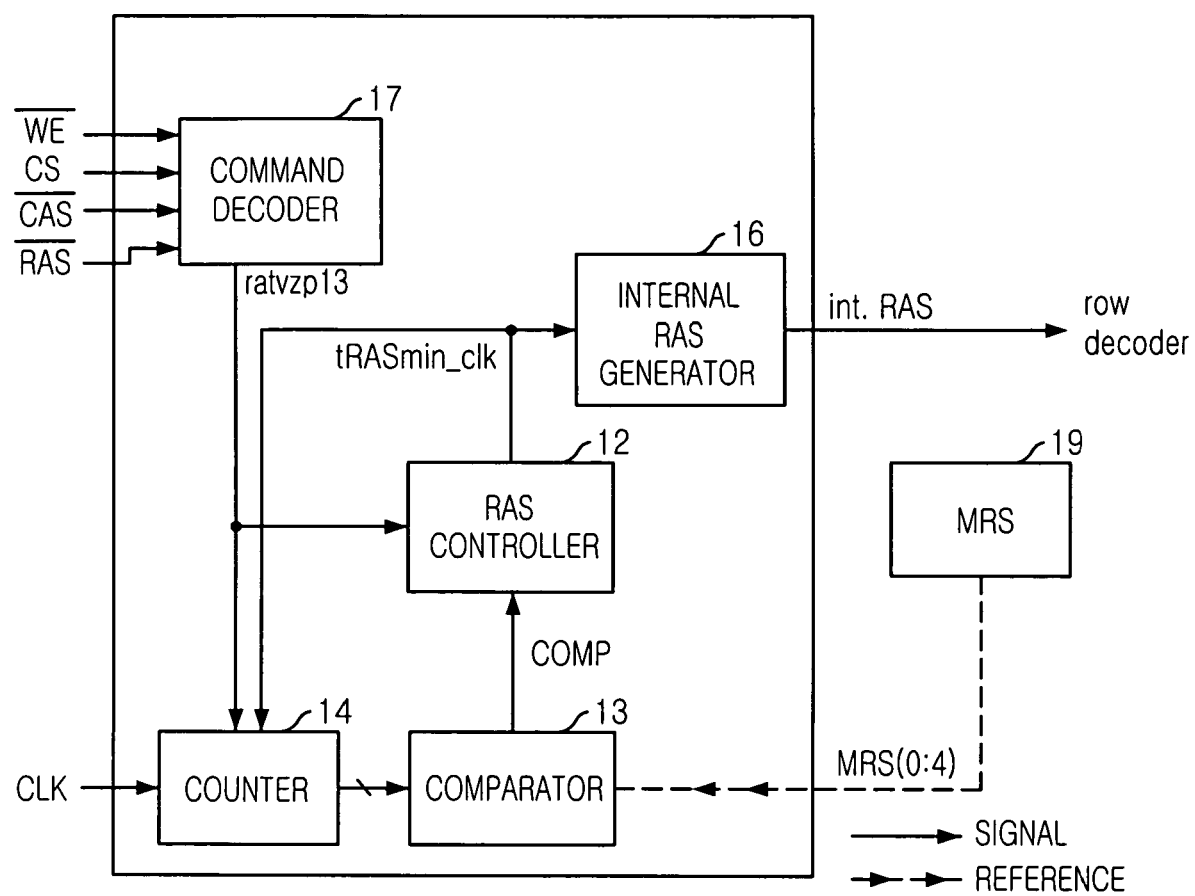
FIG. 2 is a block diagram of a RAS time control circuit in accordance with a first embodiment of the present invention.

In step S110, the command decoder of the DRAM shown in FIG. 2 receives the external signals /RAS, /CAS, CS and /WE. The commands instructed from the external circuit to the DRAM are combinations of the above signals and the command decoder 17 decodes the external commands from the combinations of the above signals. When the command decoder 17 performs the commands, such as a data read/write command, a refresh command and a precharge command, the RAS time control circuit in accordance with the first embodiment of the present invention is operated.

In step S120, if a decoded command is identified as a command to activate the above-described internal RAS signals, the command decoder 17 generates the row active pulse ratvzp13. The row active pulse ratvzp13 is transferred to the counter 14 and the RAS controller 12 as a start signal for generating the internal RAS signal int.RAS. In one embodiment, it is preferable that the row active pulse ratvzp13 has a pulse waveform having shorter period than other control signals. However, the present invention is not limited to it.

In step S130', the counter 14 receives the row active pulse ractzp13, resets all flip-flops to zero, and then is ready to again perform the counting operation.

In step S130, if the RAS controller 12 receives the row active pulse ratvzp13, the RAS controller 12 changes the RAS time control signal tRASmin_clk to a high level. Also, even when there is a RAS signal that has been outputted, the RAS controller 12 outputs the RAS time control signal tRASmin_clk of a high level regardless of the previous output value. Here, the steps S130 and S130' may be overlapped or reversed.

The RAS time control signal tRASmin_clk is outputted to the internal RAS generator 16 and the counter 14. If the RAS time control signal tRASmin_clk is changed to a high level, the counter 14 performs the counting operation to count the input number of the external clock. If necessary, the step S130' can be omitted by including the step of resetting the counter in step S140 of operating the counter 14.

In step S150, the clock number counted by the counter 14 is inputted to the comparator 13, and the comparator 13 compares the counted clock number with the comparison reference value recorded in the mode register 19.

In steps S150 to S154, the comparator 13 receives the count value and compares the count value with the comparison reference value. In step S156, if the count value is different from the comparison reference value, the comparator 13 maintains/changes the comparison index comp to a high level and receives a next count number to continue to perform the step S150. Here, in step S156, if the comparison index comp is a low level, the comparison index comp is changed to a high level, and if a previous comparison index is a high level, the comparison index comp maintains a high level.

In steps S154 and S160, if the count number is identical to the comparison reference value, the comparator 13 changes the comparison index comp to a low level. Thus, the process escapes from the iterative step S150. In step S170, if the comparison index comp is changed to a low level, the RAS controller 12 changes the RAS time control signal tRASmin_clk to a low level.

In step S180, if the RAS time control signal tRASmin_clk is changed to a low level, the counter 14 stops the counting operation.

The internal RAS generator 16 generates the internal RAS signal int.RAS in response to the RAS time control signal tRASmin_clk. The delay time of the internal RAS signal int.RAS is maintained as long as the predetermined clock periods in response to the RAS time control signal tRASmin_clk. Since the internal RAS signal int.RAS is generally a low active signal, the internal RAS signal int.RAS of a low level is outputted in a high period of the RAS time control signal tRASmin_clk instructing the activation of the RAS signal. The internal RAS signal int.RAS is supplied to a part for controlling the respective cell areas and used as a control signal for a read/write operation with respect to the memory cells.

Embodiment 2

A RAS time control circuit in accordance with a second embodiment of the present invention will be described below with reference to FIG. 3.

The RAS time control circuit includes a command decoder 27 for decoding an external signal, a counter 24 for counting the number of clocks inputted from an external circuit, a comparator 23 for comparing the counted clock number with a preset comparison reference value, a RAS controller 22 for determining a delay time of an internal RAS signal int.RAS from the comparison result of the comparator 23, an internal RAS generator 26 for maintaining the internal RAS signal int.RAS according to an instruction of the RAS controller 22, and a legacy delay part 25 for determining a delay time of the internal RAS signal in the self refresh operation. Preferably, the RAS time control circuit may further include a circuit for recording the comparison reference value and the kinds of the legacy. In one embodiment, the two data can be recorded in a mode register 29. However, the present invention is not limited to it.

In this embodiment, in the case of the self refresh operation, a legacy delay part (consisting of an inverter and a capacitor) is used to secure the RAS time tRAS. For this purpose, the legacy delay part 25 and a switching part 21 are added to the first embodiment.

In this embodiment, a RAS time control signal tRASmin_clk is a high enable signal and the internal RAS signal int.RAS is enabled while the RAS time control signal tRASmin_clk is in an enabled state. The internal RAS signal int.RAS is a low enable signal. The comparison result of the comparator 23 is a high section when the counter 24 is operated and generates a comparison index signal comp falling when both comparison values are identical to each other.

Like the first embodiment, the comparison reference value of the comparator 23 can be designated in the mode register 29. It is preferable that the comparison reference value designated in the mode register 29 is determined by comparing a delay time of a preferable RAS signal with a period of an external clock.

The command decoder 27 receives external signals /RAS, /CAS, CS and /WE from an outside of the DRAM chip and decodes commands contained in the signals based on a DRAM specification, and records the decoded kind of the refresh in a refresh indicator tRAS_nop and outputs a row active pulse ratvzp13. The row active pulse ratvzp13 is a start signal for a specific operation of the counter 24 and the RAS controller 22. The refresh indicator tRAS_nop can be implemented with one register contained in the mode register 29. However, the present invention is not limited to it.

A preferable implementation, operation and I/O line connection of the counter 24 and the comparator 23 is almost identical to that of the first embodiment. A difference is that at least one of the counter 24 and the comparator 23 is controlled in response to a control signal outputted from the switching part 21.

The comparator 23 compares the counted clock number inputted from the counter 24 with the comparison reference values recorded in the mode register 29. If the clock number is identical to the comparison reference value, that the RAS time period is maintained sufficiently is notified through the comparison index comp to the RAS controller 22. The output of the comparison index comp is latched, so that a previous output value is continuously maintained until a next comparison result. If the count number is identical to the comparison reference value, the comparison index comp is changed to a low level. Then, the comparison index comp is changed to a high level when the RAS time control signal tRASmin_clk is activated.

The RAS controller 22 outputs the RAS time control signal tRASmin_clk to the internal RAS generator 26. The RAS time control signal tRASmin_clk is changed to a high level when the row active pulse is inputted. Meanwhile, the RAS time control signal tRASmin_clk is changed to a low level when the comparison index comp is changed to a low level.

The internal RAS generator 26 receives the RAS time control signal tRASmin_clk from the RAS controller 22 and enables the internal RAS signal int.RAS while the RAS time control signal tRASmin_clk is in a high level.

The legacy delay part 25 has the same structure as a delay circuit used to delay the internal RAS signal int.RAS in the conventional DRAM and generally consists of an inverter and a capacitor. The legacy delay part 25 receives the internal RAS signal (or the RAS time control signal) and outputs a delay completion signal to the switching part 21 after a predetermined delay time elapses from an enable time point of the internal RAS signal.

The switching part 21 decides whether the delay time of the internal RAS signal int.RAS is determined by a counting of the external clock or by the legacy delay part 25. The method of counting the external clock in accordance with an embodiment of the present invention is selected in all other refresh where the clock is inputted, except the self refresh where the external clock is not inputted. In one embodiment, the kind of the refresh, which is requested from an outside, is recorded in the refresh indicator 29 and then the selection can be achieved depending on the recorded value. However, the present invention is not limited to it.

The structure of the switching part 21 can includes a legacy switch for controlling the use of the legacy delay part 25, and a clock counting switch for controlling the use of the delay circuit depending on the external clock.

Figure 9:
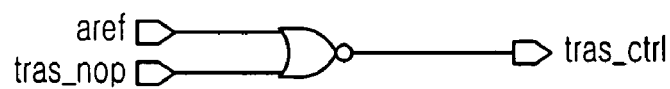
FIG. 9 is a circuit diagram illustrating a clock counting switch of the second and fourth embodiments.
Figure 10:
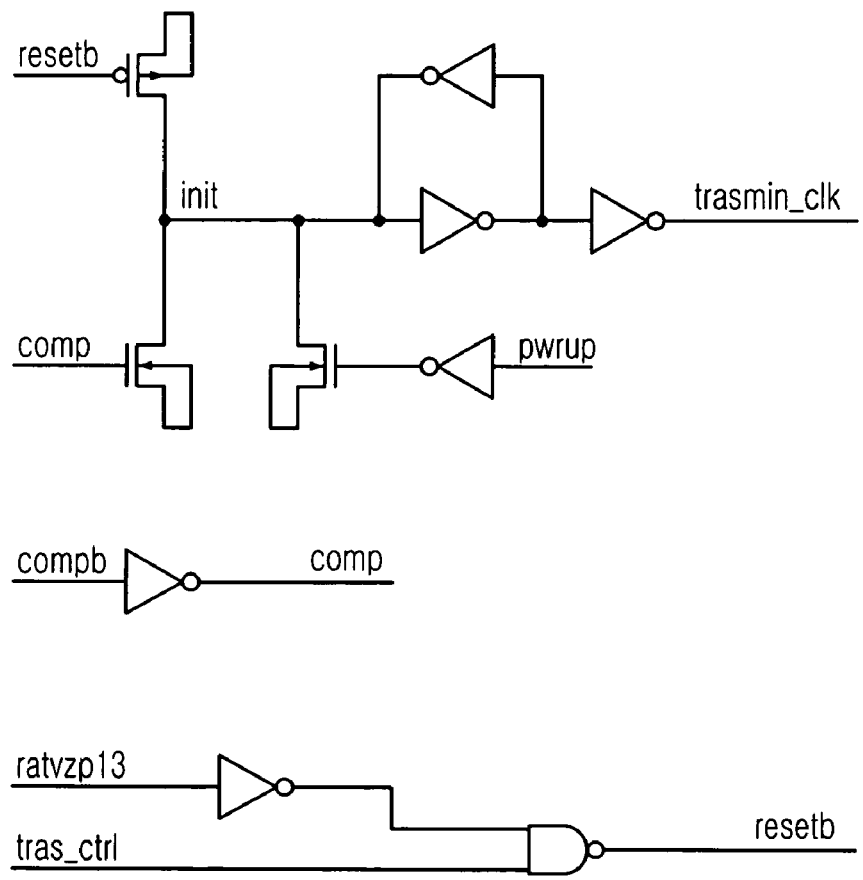
FIG. 10 is a circuit diagram of a RAS controller in accordance with an embodiment of the present invention.

As shown in FIG. 9, the clock counting switch receives the refresh indicator signal tRAS_nop and the refresh command (which is implemented with an internal command line outputted as a command decoding result of the command decoder) and outputs a counting operation signal tRAS_ctrl. As shown in FIG. 7, the counting operation signal tRAS_ctrl becomes an operation condition signal of the counter 24. In one embodiment, the counting operation signal tRAS_ctrl can also control the operation of the comparator 23.

Except the self refresh operation, the legacy switch can be implemented to stop the operation of the legacy delay part 25. In one embodiment, it is preferable that the legacy delay part 25 always operates and its output is connected to the RAS controller 22 only in the self refresh operation so as to easily apply the conventional semiconductor process. However, the present invention is not limited to it. The legacy switch can be configured with a switching MOS transistor having a gate receiving the refresh indicator signal tRAS_nop.

In the refresh operations except the self refresh operation, the command decoder 27 records "0" in the refresh indicator tRAS_nop. When the refresh command has a value of "0", it represents an activation of the refresh command. When both values are "0", the counting operation signal tRAS_ctrl is set to "1".

As shown in FIG. 7, the counting operation signal tRAS_ctrl having the set value of "1" becomes the condition signal for operating the counter 24.

A method for generating the RAS time control signal used in the internal RAS delay circuit will be described below.

In step S110, the command decoder 27 decodes the command inputted from an outside of the DRAM. In step S120, the command decoder 27 generates the row active pulse ratvzp13 to the counter 24 and the RAS controller 22. The steps S110 and S120 are the common process.

In step S130, the counter 24 is reset in response to the row active pulse ratvzp13, and the RAS controller 22 enables the RAS time control signal tRASmin_clk transferred to the counter 24. In step S140, the counter 24 starts to operate in response to the transition of the RAS time control signal tRASmin_clk. In step S150, the comparator 23 receives the count number from the counter 24 and compares the count number with the preset comparison reference value. If the count number is different from the comparison reference value, the comparison index comp is repetitively changed and maintained to a high level. In step S160, if the count number is identical to the comparison reference value, the comparator 23 changes the comparison index comp to a low level. In step S170, the RAS controller 22 receives the high-to-low transition of the comparison index comp and changes the RAS time control signal tRASmin_clk to a low level. In step S180, the counter 24 receives the high-to-low transition of the RAS time control signal tRASmin_clk and stops its operation. Here, the steps S130 to S180 are the clock counting process.

In step S220, the legacy delay part 25 receives the internal RAS signal int.RAS enabled in response to the RAS time control signal tRASmin_clk. In step S230, the legacy delay part 25 outputs the delay completion signal after a predetermined time elapses from the enable time point of the inputted internal RAS signal int.RAS. In step S240, the RAS controller 22 receives the delay completion signal and disables the RAS time control signal tRASmin_clk. The steps S220 to S240 are the legacy delay process.

If the command decoded in the step S110 is the self refresh, the RAS time control signal tRASmin_clk is adjusted using the clock counting process. If the decoded command is not the self refresh, the RAS time control signal tRASmin_clk is adjusted using the legacy delay process.

Like the first embodiment, the mode register setting step of recording "5" as the comparison reference value in the mode register (MRS) of the DRAM is performed prior to the above steps.

Figure 3:
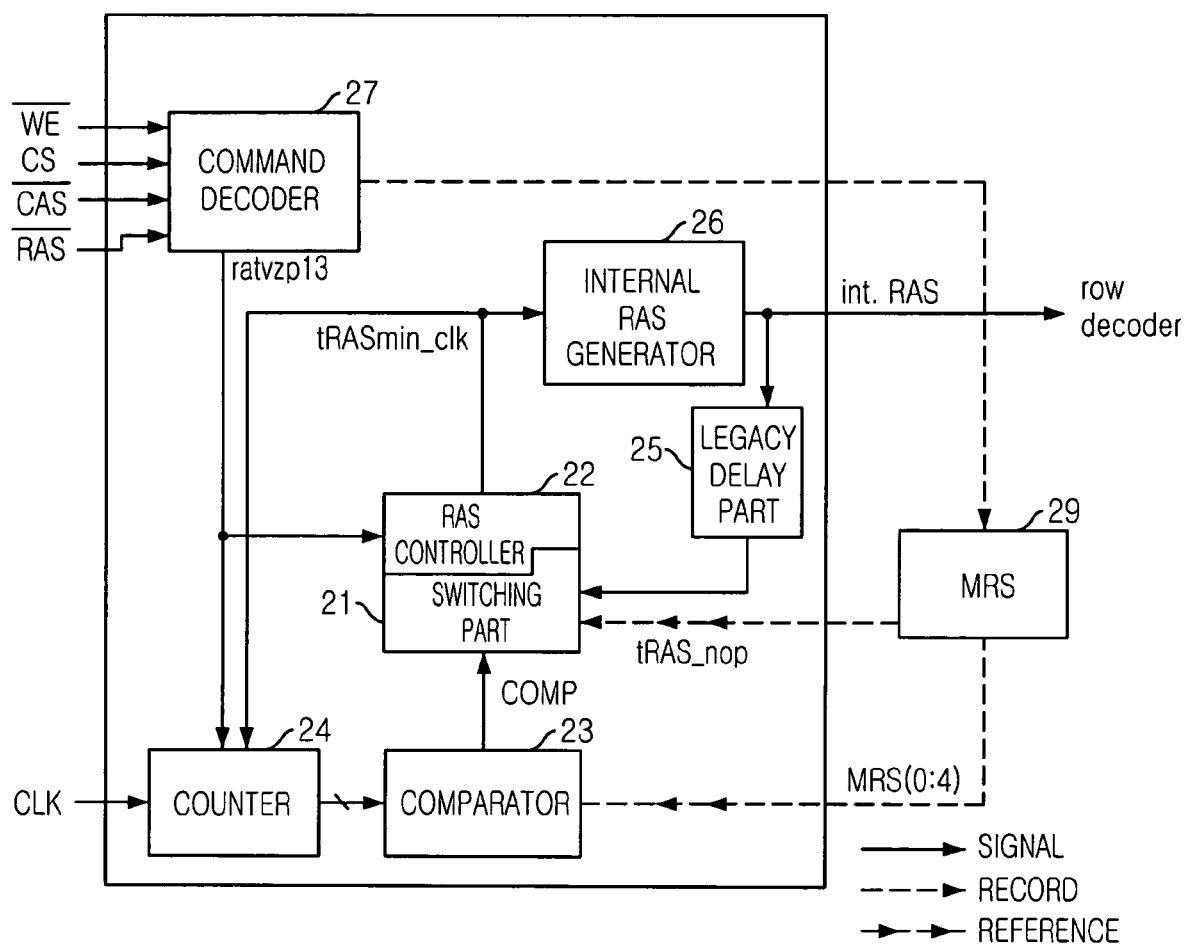
FIG. 3 is a block diagram of a RAS time control circuit in accordance with a second embodiment of the present invention.

In step S110, the command decoder of the DRAM shown in FIG. 3 receives the external signals /RAS, /CAS, CS and /WE, and the command decoder 27 decodes the external commands from the combinations of the above signals. In step S115, if the decoded command is the self refresh, "1" is recorded in the refresh indicator. Meanwhile, if the decoded command is the other refreshes, "0" is recorded in the refresh indicator.

In step 120, if the decoded command is identified as a command to activate the internal RAS signal, the command decoder 27 generates the row active pulse ratvzp13. The steps S115 and S120 can be overlapped or reversed.

The row active pulse ratvzp13 is transferred to the counter 24 and the RAS controller 22 as a start signal for the internal RAS generating process. In step S130', the counter 24 receives the row active pulse ractzp13, resets all flip-flops to zero, and then is ready to again perform the counting operation.

In step S130, if the RAS controller 22 receives the row active pulse ratvzp13, the RAS controller 22 changes the RAS time control signal tRASmin_clk to a high level.

The RAS time control signal tRASmin_clk is outputted to the internal RAS generator 26 and the counter 24. If the RAS time control signal tRASmin_clk is changed to a high level, the counter 24 performs the counting operation to count the input number of the external clock. If necessary, the step S130' can be omitted by including the step of resetting the counter 24 in step S140 of operating the counter 24.

In step S150, the clock number counted by the counter 24 is inputted to the comparator 23, and the comparator 23 compares the count number with the comparison reference value recorded in the mode register 29.

In steps S150 to S154, the comparator 23 receives the count value and compares the count value with the comparison reference value. In step S156, if the count value is different from the comparison reference value, the comparator 23 maintains/changes the comparison index comp to a high level and receives a next count number to continue to perform the step S150.

In steps S154 and S160, if the count number is identical to the comparison reference value, the comparator 23 changes the comparison index comp to a low level. Thus, the process escapes from the iterative step S150. In step S170, if the comparison index comp is changed to a low level, the RAS controller 22 changes the RAS time control signal tRASmin_clk to a low level. In step S180, if the RAS time control signal tRASmin_clk is changed to a low level, the counter 24 stops he counting operation.

If the external command is the self refresh, the operation of the counter 24 is stopped due to the refresh indicator tRAS_nop of "1", as shown in FIGS. 7 and 9. Thus, the clock counting process of steps S130 to S180 is not performed. Only the RAS time control signal tRASmin_clk is enabled in the step S130 and then the legacy delay process of steps S220 to S240 are performed.

In the step S220, in most cases, the legacy delay part receives the internal RAS signal int.RAS. In some cases, the legacy delay part can be configured to receive the RAS time control signal tRASmin_clk.

The delay process performed by the legacy delay part 25 can be implemented to stop its operation by the refresh indicator tRAS_nop. For simplicity of the modification, it can be implemented to always perform the legacy delay process and control only the input of its result output into the RAS controller 22 by the switching part 21.

The internal RAS generator 26 generates the internal RAS signal int.RAS in response to the RAS time control signal tRASmin_clk. The delay time of the internal RAS signal int.RAS is maintained as long as the predetermined clock periods in response to the RAS time control signal tRASmin_clk. The internal RAS signal int.RAS is supplied to a part for controlling the respective cell areas and used as a control signal for a read/write operation with respect to the memory cells.

If the command decoded by the command decoder 27 is the self refresh, the external clock cannot be received in the self refresh under the current DRAM specification. Thus, like the prior art, the delay must be calculated by the legacy delay part 25. In this embodiment, the legacy delay part 25 always calculates the delay time and outputs the resulting delay completion signal at a falling time point of the internal RAS signal int.RAS. Only when the refresh indicator tRAS_nop is "0", the output of the legacy delay part 25 is inputted to the RAS controller 22 by the switching part 21. At this point, the RAS controller 22 maintains the internal RAS signal int.RAS according to the output signal of the legacy delay part 25.

Accordingly, if the command is not the self refresh, the internal RAS signal int.RAS can be maintained for a demanded time according to the input number of the external clocks. Meanwhile, if the command is the self refresh, the internal RAS signal int.RAS can be maintained for a demanded time by using the conventional delay circuit consisting of the inverter and the capacitor.

Embodiment 3

The RAS time control circuit in accordance with a third embodiment of the present invention includes a command decoder 47 for decoding an external signal, a counter 44 for counting the number of external clocks, a comparator 43 for comparing the counted clock number with a sum of a preset comparison reference value and an added value according to the kinds of inputted commands, and the counted clock number, a RAS controller 42 for determining a delay time of an internal RAS signal int.RAS from the comparison result of the comparator 43, and an internal RAS generator 46 for maintaining the internal RAS signal int.RAS according to the instruction of the RAS controller 42.

In one embodiment, a circuit for storing the added values according to the kinds of the command and a circuit for storing the comparison reference value can be integrated in a mode register 49 for storing set values with respect to the control of the RAS time. However, the present invention is not limited to it.

In this embodiment, there is additionally provided a part for adjusting the comparison reference value for determining the RAS time according to the kinds of the inputted commands. For this purpose, the integrated storing part for storing the added values are further included in the mode register 49.

A RAS time control signal tRASmin_clk is a high enable signal and the internal RAS signal int.RAS is enabled while the RAS time control signal tRASmin_clk is in an enabled state. The internal RAS signal int.RAS is a low enable signal. The comparison result of the comparator 13 is a high section when the counter 14 is operated and generates a comparison index signal comp falling when both comparison values are identical to each other.

The mode register 49 stores the comparison reference value and the added values according to the commands. The comparison reference value is previously determined before the refresh operation by comparing a delay time of a preferable RAS signal with a period of the external clock.

The command decoder 47 receives external signals /RAS, /CAS, CS and /WE from an outside of the DRAM chip and decodes commands contained in the signals based on a DRAM specification. Then, the command decoder 47 calculates the added value according to the kinds of the decoded commands and stores the added value in the added value storing part, and then outputs a row active pulse ratvzp13. The row active pulse ratvzp13 becomes a start signal for a specific operation of the counter 44 and the RAS controller 42.

An implementation, operation and I/O line connection are identical to those of the first embodiment. The comparator 43 compares the sum of the preset comparison reference value and the added value with the counted clock number. If the sum is identical to the counted clock number, the comparator 43 performs the operation of changing a level of the comparison index comp.

In the structure of the comparator shown in FIG. 8, an additional summer is additionally provided and MRS input terminals are connected to output terminals of the summer bit by bit. In this case, the summer receives the comparison reference values mrs<0:4> and the values stored in the added value storing part and outputs the sum of them to the output terminals.

For the detailed description, it is assumed that commands A, B and C require 40 nsec, 50 nsec and 70 nsec as the minimum RAS time tRASmin under a system clock environment having a period of 10 nsec. In this case, "5" is stored as the comparison reference value. If the command A is inputted to the added value storing part, "−1" is stored as the added value. If the command B is inputted to the added value storing part, "0" is stored as the added value. If the command C is inputted to the added value storing part, "2" is stored as the added value.

Accordingly, in the case of the command A, the comparator compares the count number with "4". In the case of the command B, the comparator compares the count number with "5". In the case of the command C, the comparator compares the count number with "7". Thus, each desired RAS time can be maintained using the system clock of 10 nsec.

That the RAS time period is maintained sufficiently is notified through the comparison index comp to the RAS controller 42 by the comparator 43. The comparison index comp is latched, so that a previous output value is continuously maintained until a next comparison result. If the count number is identical to the comparison reference value, the comparison index comp is changed to a low level. Then, the comparison index comp is changed to a high level when the RAS time control signal tRASmin_clk is activated.

The RAS controller 42 outputs the RAS time control signal tRASmin_clk to the internal RAS generator 46. The RAS time control signal tRASmin_clk is changed to a high level when the row active pulse ratvzp13 is inputted. Meanwhile, the RAS time control signal tRASmin_clk is changed to a low level when the comparison index comp is changed to a low level.

The internal RAS generator 46 receives the RAS time control signal tRASmin_clk from the RAS controller 42 and enables the internal RAS signal int.RAS while the RAS time control signal tRASmin_clk is in a high level.

A method for generating the RAS time control signal used in the internal RAS time delay circuit in accordance with the third embodiment of the present invention will be described below with reference to FIG. 12.

In step S310, the command decoder 47 decodes the command inputted from an outside of the DRAM. In step S315, the added values with respect to the decoded command is calculated and stored. In step S320, the command decoder 47 generates the row active pulse ratvzp13 to the counter 44 and the RAS controller 42. In step S330, the counter 44 is reset in response to the row active pulse ratvzp13, and the RAS controller 42 enables the RAS time control signal tRASmin_clk transferred to the counter 44. In step S340, the counter 44 starts to operate in response to the enabled RAS time control signal tRASmin_clk. In step S350, the comparator 43 compares the sum of the preset comparison reference value and the added value with the count number inputted from the counter 44. If they are different from one another, the comparison index comp is changed to a high level. In step S360, if they are identical to one another, the comparator 43 changes the comparison index comp to a low level. In step S370, the RAS controller 42 receives the high-to-low transition of the comparison index comp and disables the RAS time control signal tRASmin_clk. In step S380, the counter 44 receives the disabling of the RAS time control signal tRASmin_clk and stops its operation.

Under the system clock environment of 10 nsec, if the CPU or chipset requests the DRAM to set the comparison value to "5", the mode register setting step of recording "5" as the comparison reference value in the mode register 49 is performed prior to the above steps.

Figure 4:
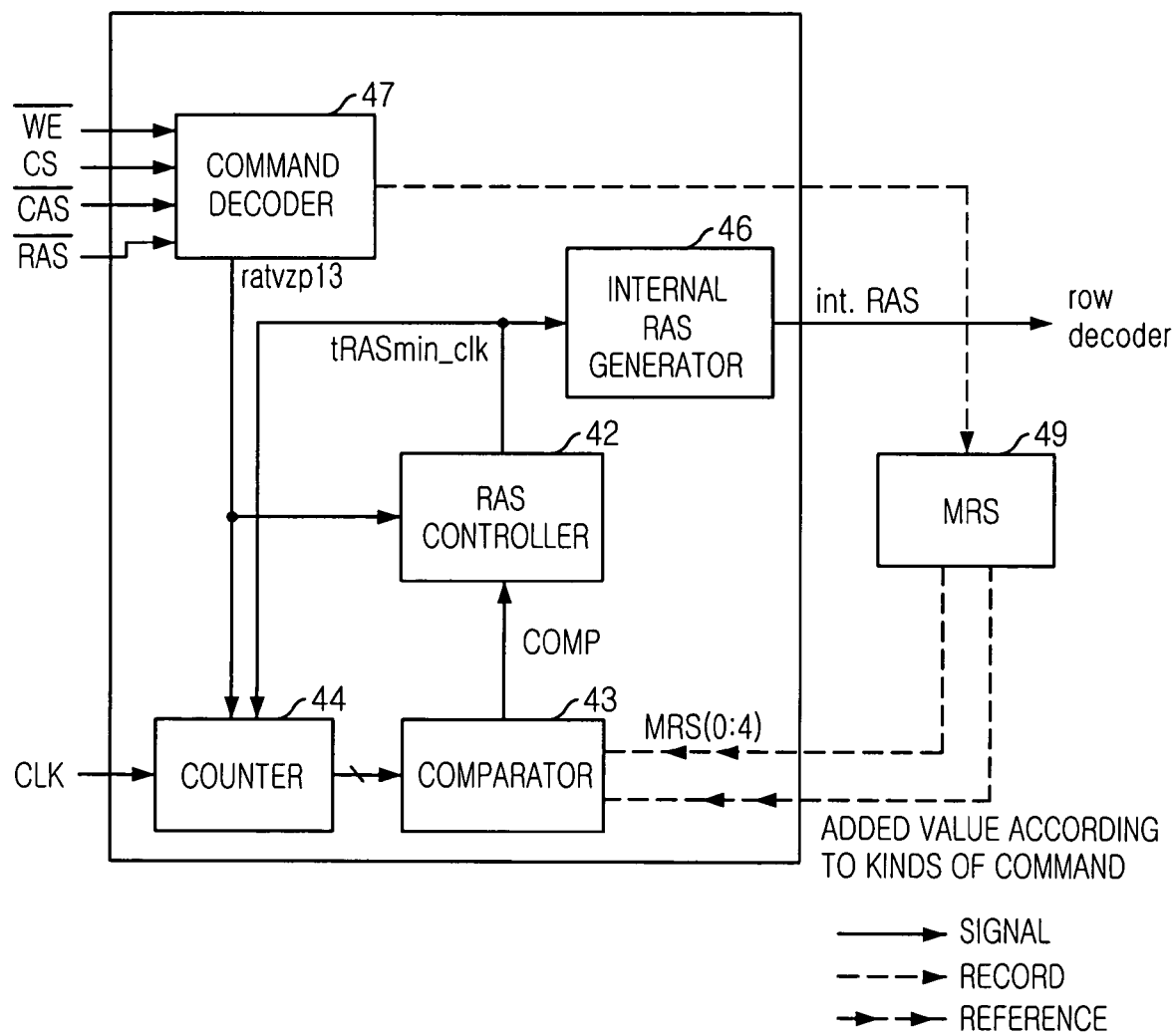
FIG. 4 is a block diagram of a RAS time control circuit in accordance with a fourth embodiment of the present invention.

In step S310, the command decoder 47 shown in FIG. 4 receives the external signals /RAS, /CAS, CS and /WE and decodes the external commands from the combinations of the above signals. In step S315, the command decoder 47 calculates the added values with respect to the decoded commands and stores them in the added value storing part of the mode register (MRS) 49. In some cases, the mode register (MRS) 49 can stores the values of identifying the kinds of the commands, and the comparator 43 can calculate the added values according to the kinds of the commands. In addition, in step S320, if a decoded command is identified as a command to activate the above-described internal RAS signals, the command decoder 47 generates the row active pulse ratvzp13.

The row active pulse ratvzp13 is transferred to the counter 44 and the RAS controller 42 as a start signal for generating the internal RAS signal int.RAS. In step S330', the counter 44 receives the row active pulse ractzp13, resets all flip-flops to zero, and then is ready to again perform the counting operation.

In step S330, if the RAS controller 42 receives the row active pulse ratvzp13, the RAS controller 42 changes the RAS time control signal tRASmin_clk to a high level.

The RAS time control signal tRASmin_clk is outputted to the internal RAS generator 46 and the counter 44. If the RAS time control signal tRASmin_clk is changed to a high level, the counter 44 performs the counting operation to count the input number of the external clock. If necessary, the step S330' can be omitted by including the step of resetting the counter in step S340 of operating the counter 44.

In step S350, the clock number counted by the counter 44 is inputted to the comparator 43, and the comparator 43 compares the counted clock number with the sum of the comparison reference value recorded in the mode register 49 and the added values.

In steps S350 to S354, the comparator 43 receives the count value and compares the count value with the sum of the preset comparison reference value and the added values. In step S356, if the count value is different from the sum, the comparator 43 maintains/changes the comparison index comp to a high level and receives a next count number to continue to perform the step S350.

In steps S354 and S360, if the count number is identical to the comparison reference value, the comparator 43 changes the comparison index comp to a low level. Thus, the process escapes from the iterative step S350. In step S370, if the comparison index comp is changed to a low level, the RAS controller 42 changes the RAS time control signal tRASmin_clk to a low level. In step S380, if the RAS time control signal tRASmin_clk is changed to a low level, the counter 44 stops the counting operation.

The internal RAS generator 46 generates the internal RAS signal int.RAS in response to the RAS time control signal tRASmin_clk. The delay time of the internal RAS signal int.RAS is maintained as long as the predetermined clock periods in response to the RAS time control signal tRASmin_clk. The internal RAS signal int.RAS of a low level is outputted in a high period of the RAS time control signal tRASmin_clk instructing the activation of the RAS signal. The internal RAS signal int.RAS is supplied to a part for controlling the respective cell areas and used as a control signal for a read/write operation with respect to the memory cells.

Embodiment 4

The RAS time control circuit in accordance with a fourth embodiment of the present invention includes a command decoder 67 for decoding an external signal, a counter 64 for counting the number of external clocks, a comparator 63 for comparing with the counted clock number with a sum of a preset comparison reference value and an added value according to the kinds of inputted commands, a RAS controller 62 for determining a delay time of an internal RAS signal int.RAS from the comparison result of the comparator 63, an internal RAS generator 66 for maintaining the internal RAS signal int.RAS according to the instruction of the RAS controller 42, and a legacy delay unit 65 for determining a delay time of the internal RAS signal int.RAS in the self refresh operation.

In one embodiment, a circuit for storing the added values according to the kinds of the command and a circuit for storing the comparison reference value can be integrated in a mode register 69 for storing set values for the control of the RAS time. In the case of the self refresh mode, the added values can have a specific indicating value (for example, 0xff). However, the present invention is not limited to it.

This embodiment additionally provides a function of adjusting the comparison reference value to determine the RAS time according to the kinds of the inputted commands and a function of securing the RAS time in the self refresh operation by using a legacy delay part consisting of an inverter and a capacitor. For this purpose, the added value storing part is integrated in the mode register, and a legacy delay part 65 and a switching part 61 are additionally provided in the elements of the third embodiment.

A RAS time control signal tRASmin_clk is a high enable signal and the internal RAS signal int.RAS is enabled while the RAS time control signal tRASmin_clk is in an enabled state. The internal RAS signal int.RAS is a low enable signal. The comparison result of the comparator 63 is a high section when the counter 64 is operated and generates a comparison index signal comp falling when both comparison values are identical to each other.

The mode register 69 stores the comparison reference value and the added values according to the commands. The comparison reference value is previously determined before the refresh operation by comparing a delay time of a preferable RAS signal with a period of the external clock. In the case of the self refresh, the self refresh indicating value is stored in the added value. In one embodiment, the self refresh indicating value can be a minimum or maximum value (for example, 0xff) that can be expressed by the added value storing part.

The command decoder 67 receives external signals /RAS, /CAS, CS and /WE from an outside of the DRAM chip and decodes commands contained in the signals based on a DRAM specification. Then, the command decoder 67 calculates the added value according to the kinds of the decoded commands and stores the added value in the added value storing part, and then outputs a row active pulse ratvzp13. The row active pulse ratvzp13 becomes a start signal for a specific operation of the counter 64 and the RAS controller 62. An implementation, operation and I/O line connection are identical to those of the first embodiment. A difference is that at least one of the counter 64 and the comparator 63 is controlled in response to a control signal outputted from the switching part 61.

The comparator 63 compares the sum of the preset comparison reference value and the added values with the counted clock number. If the sum is identical to the counted clock number, the comparator 63 performs the operation of changing a level of the comparison index comp.

In the structure of the comparator shown in FIG. 8, an additional summer is additionally provided and MRS input terminals are connected to output terminals of the summer bit by bit. In this case, the summer receives the comparison reference values mrs<0:4> and the values stored in the added value storing part and outputs the sum of them to the output terminals.

That the RAS time period is maintained sufficiently is notified through the comparison index comp to the RAS controller 62 by the comparator 63. The comparison index comp is latched, so that a previous output value is continuously maintained until a next comparison result. If the count number is identical to the comparison reference value, the comparison index comp is changed to a low level. Then, the comparison index comp is changed to a high level when the RAS time control signal tRASmin_clk is activated.

The RAS controller 62 outputs the RAS time control signal tRASmin_clk to the internal RAS generator 66. The RAS time control signal tRASmin_clk is changed to a high level when the row active pulse ratvzp13 is inputted. Meanwhile, the RAS time control signal tRASmin_clk is changed to a low level when the comparison index comp is changed to a low level.

The internal RAS generator 66 receives the RAS time control signal tRASmin_clk from the RAS controller 62 and enables the internal RAS signal int.RAS while the RAS time control signal tRASmin_clk is in a high level.

The legacy delay part 65 has the same structure as the delay circuit used to delay the internal RAS signal in the conventional DRAM and is identical to the delay part of the second embodiment.

The switching part 61 decides whether the delay time of the internal RAS signal int.RAS is determined by a counting of the external clock or by the legacy delay part 65. The method of counting the external clock in accordance with an embodiment of the present invention is selected in all other refresh where the clock is inputted, except the self refresh where the external clock is not inputted. In one embodiment, it can be implemented according to the existence of the self refresh indicating value stored in the added value storing part of the mode register 69.

The structure of the switching part 61 can includes a legacy switch for controlling the use of the legacy delay part 65, and a clock counting switch for controlling the use of the delay circuit depending on the external clock.

As shown in FIG. 9, the clock counting switch receives the refresh indicator signal tRAS_nop and the refresh command (which is implemented with an internal command line outputted as a command decoding result of the command decoder) and outputs a counting operation signal tRAS_ctrl. As shown in FIG. 7, the counting operation signal tRAS_ctrl becomes an operation condition signal of the counter 64. In one embodiment, the counting operation signal tRAS_ctrl can also control the operation of the comparator 63. In this embodiment, in the case of the self refresh, since all bit values stored in the added value storing part are "1", an AND gate logic circuit (not shown) is additionally provided so that the refresh indicator signal tRAS_nop can have the value "1" when the values recorded in all flip-flops of the added value storing part are "1".

Except the self refresh operation, the legacy switch can be implemented to stop the operation of the legacy delay part 65. In one embodiment, it is preferable that the legacy delay part 65 always operates and its output is connected to the RAS controller 22 only in the self refresh operation so as to easily apply the conventional semiconductor process. However, the present invention is not limited to it. The legacy switch can be configured with a switching MOS transistor having a gate receiving the refresh indicator signal tRAS_nop.

In the refresh operations except the self refresh operation, the counting operation signal tRAS_ctrl is set to "1". As shown in FIG. 7, the counting operation signal tRAS_ctrl having the set value of "1" becomes the condition signal for operating the counter 24.

A method for generating the RAS time control signal used in the internal RAS time delay circuit in accordance with the fourth embodiment of the present invention will be described below with reference to FIG. 12.

In step S310, the command decoder 67 decodes the command inputted from an outside of the DRAM. In step S315, the added values with respect to the decoded command is calculated and stored. In step S320, the command decoder 67 generates the row active pulse ratvzp13 to the counter 64 and the RAS controller 62. The steps S310 to S320 are the common process.

In step S330, the counter 64 is reset in response to the row active pulse ratvzp13, and the RAS controller 62 enables the RAS time control signal tRASmin_clk transferred to the counter 64. In step S340, the counter 64 starts to operate in response to the enabled RAS time control signal tRASmin_clk. In step S350, the comparator 63 compares the sum of the preset comparison reference value and the added values according to the commands with the count number inputted from the counter 64. If the sum is different from the count number, the comparison index comp is repetitively changed/maintained to a high level. In step S360, if the sum is identical to the count number, the comparator 63 changes the comparison index comp to a low level. In step S370, the RAS controller 62 receives the high-to-low transition of the comparison index comp and disables the RAS time control signal tRASmin_clk. In step S380, the counter 64 stops its operation according to the disabled RAS time control signal tRASmin_clk. The steps S330 to S380 are the clock counting process.

In step S420, the legacy delay part 65 receives the internal RAS signal int.RAS enabled in response to the RAS time control signal tRASmin_clk. In step S430, the legacy delay part 65 outputs the delay completion signal after a predetermined time elapses from the enable time point of the inputted internal RAS signal int.RAS. In step S440, the RAS controller 62 receives the delay completion signal and disables the RAS time control signal tRASmin_clk. The steps S420 to S440 are the legacy delay process.

If the command decoded in the step S310 is the self refresh, the RAS time control signal tRASmin_clk is adjusted using the clock counting process. If the decoded command is not the self refresh, the RAS time control signal tRASmin_clk is adjusted using the legacy delay process.

Under the system clock environment of 10 nsec, if the CPU or chipset requests the DRAM to set the comparison value to "5", the mode register setting step of recording "5" as the comparison reference value in the mode register 69 is performed prior to the above steps.

Figure 5:
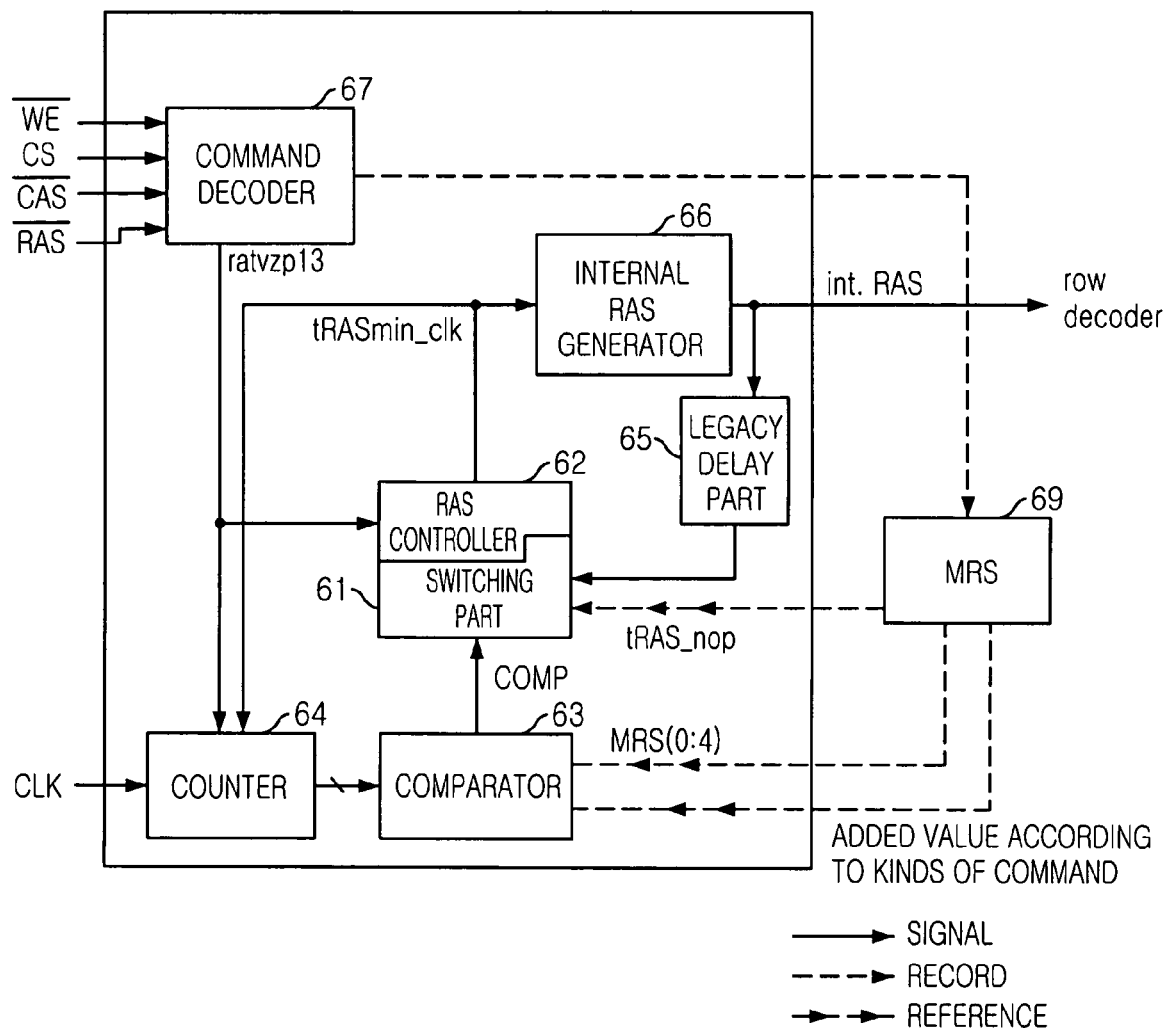
FIG. 5 is a block diagram of a RAS time control circuit in accordance with a fifth embodiment of the present invention.

In step S310, the command decoder 67 shown in FIG. 5 receives the external signals /RAS, /CAS, CS and /WE and decodes the external commands from the combinations of the above signals. In step S315', the command decoder 67 calculates the added values with respect to the decoded commands and stores them in the added value storing part of the mode register (MRS) 69. If the inputted command is the self refresh, the maximum(minimum) value is recorded in the added value storing part. In some cases, the mode register (MRS) 69 can stores the values of identifying the kinds of the commands, and the comparator 63 can calculate the added values according to the kinds of the commands. In addition, in step S320, if a decoded command is identified as a command to activate the above-described internal RAS signals, the command decoder 67 generates the row active pulse ratvzp13.

The row active pulse ratvzp13 is transferred to the counter 64 and the RAS controller 62 as a start signal for generating the internal RAS signal int.RAS. In step S330', the counter 64 receives the row active pulse ractzp13, resets all flip-flops to zero, and then is ready to again perform the counting operation.

In step S330, if the RAS controller 62 receives the row active pulse ratvzp13, the RAS controller 62 changes the RAS time control signal tRASmin_clk to a high level.

The RAS time control signal tRASmin_clk is outputted to the internal RAS generator 66 and the counter 64. If the RAS time control signal tRASmin_clk is changed to a high level, the counter 64 performs the counting operation to count the input number of the external clock. If necessary, the step S330' can be omitted by including the step of resetting the counter in step S340 of operating the counter 64.

In step S350, the clock number counted by the counter 64 is inputted to the comparator 63, and the comparator 63 compares the counted clock number with the sum of the comparison reference value recorded in the mode register 69 and the added value.

In steps S350 to S354, the comparator 63 receives the count value and compares the count value with the sum. In step S356, if the count value is different from the sum, the comparator 63 maintains/changes the comparison index comp to a high level and receives a next count number to continue to perform the step S350.

In steps S354 and S360, if the count number is identical to the comparison reference value, the comparator 63 changes the comparison index comp to a low level. Thus, the process escapes from the iterative step S350. In step S370, if the comparison index comp is changed to a low level, the RAS controller 62 changes the RAS time control signal tRASmin_clk to a low level. In step S380, if the RAS time control signal tRASmin_clk is changed to a low level, the counter 64 stops the counting operation.

Bit outputs of the added value storing part are connected to an AND logic circuit (not shown), and outputs of the logic circuit become the refresh indicator signal tRAS_nop. If the external command is the self refresh, the maximum value is stored as the added value. Thus, all digits of the added value storing part become "1", so that the refresh indicator signal has a value of "1". As shown in FIGS. 7 to 9, the operation of the counter 64 is stopped due to the refresh indicator signal tRAS_nop of "1". Therefore, the clock counting process of steps S330 to S380 are not performed, while only the RAS time control signal tRASmin_clk is enabled in the step S330. Thereafter, the legacy delay process of steps S420 to S440 is performed.

In the step S420, in most cases, the legacy delay part receives the internal RAS signal int.RAS. In some cases, the legacy delay part can be configured to receive the RAS time control signal tRASmin_clk.

The legacy delay process can be implemented to stop its operation by the refresh indicator tRAS_nop. For simplicity of the modification, it can be implemented to always perform the legacy delay process and control only the input of its result output into the RAS controller by the switching part.

The internal RAS generator 65 generates the internal RAS signal int.RAS in response to the RAS time control signal tRASmin_clk. The delay time of the internal RAS signal int.RAS is maintained as long as the predetermined clock periods in response to the RAS time control signal tRASmin_clk. The internal RAS signal int.RAS of a low level is outputted in a high period of the RAS time control signal tRASmin_clk instructing the activation of the RAS signal. The internal RAS signal int.RAS is supplied to a part for controlling the respective cell areas and used as a control signal for a read/write operation with respect to the memory cells.

In accordance with the first embodiment of the present invention, the minimum RAS time can be accurately secured by using the input number of the system clock.

In accordance with the second embodiment of the present invention, the minimum RAS time can be accurately secured by using the input number of the system clock. In addition, even when the system clock is not inputted, the minimum RAS time can be accurately secured by using the delay circuit consisting of the inverter and the capacitor.

In accordance with the third embodiment of the present invention, the minimum RAS time having different intervals can be secured.

In accordance with the fourth embodiment of the present invention, the minimum RAS time having different intervals can be secured by using the input number of the system clock. In addition, even when the system clock is not inputted, the minimum RAS time can be accurately secured by using the delay circuit consisting of the inverter and the capacitor.

The present application contains subject matter related to Korean patent application No. 2004-27914, filed in the Korean Patent Office on Apr. 22, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A RAS time control circuit for use in a semiconductor memory device, comprising:
   a counter for counting the number of external clocks;
   a comparator for comparing the counted clock number with a preset comparison reference value and outputting a comparison index whose level is changed when the counted clock number is identical to the comparison reference value;
   a RAS controller for outputting a RAS time control signal disabled according to a transition of the comparison index; and
   an internal RAS generator for enabling an internal RAS signal during an activation period of the RAS time control signal.

2. The RAS time control circuit as recited in claim 1, further comprising a mode register for recording the comparison reference value set from an outside of the semiconductor memory device.

3. The RAS time control circuit as recited in claim 2, further comprising a command decoder for decoding an external signal and generating a row active pulse when if the decoded signal is determined as a command to activate the internal RAS signal, wherein the RAS time control signal is enabled in response to the row active pulse.

4. The RAS time control circuit as recited in claim 3, wherein the counter is reset and operated after the generation of the row active pulse and is stopped if the RAS time control signal is disabled.

5. A RAS time control circuit for use in a semiconductor memory device, comprising:
- a command decoder for decoding an external signal;
- a counter for counting the number of external clocks;
- a comparator for comparing the counted clock number with a preset comparison reference value;
- a RAS controller for determining a delay time of an internal RAS signal from the comparison result of the comparator;
- an internal RAS generator for maintaining an internal RAS signal according to an instruction of the RAS controller; and
- a legacy delay part for determining a delay time of the internal RAS signal when the decoded signal is a self refresh.

6. The RAS time control circuit as recited in claim 5, further comprising a mode register for recording the comparison reference value set from an outside of the semiconductor memory device.

7. The RAS time control circuit as recited in claim 5, further comprising a switching part for causing the legacy delay part to control the maintaining time of the internal RAS signal in a self refresh and causing the RAS controller to control the maintaining time of the internal RAS signal in a refresh except the self refresh.

8. The RAS time control circuit as recited in claim 7, wherein the comparator outputs a comparison index whose level is changed when the counted clock number is identical to the comparison reference value;
- the RAS controller outputs a RAS time control signal disabled according to a transition of the comparison index; and
- the internal RAS generator maintains the internal RAS signal during an activation period of the RAS time control signal.

9. The RAS time control circuit as recited in claim 8, wherein the command decoder generates a row active pulse when the decoded signal is determined as a command to activate the internal RAS signal, and the RAS time control signal is enabled in response to the row active pulse.

10. The RAS time control signal as recited in claim 9, wherein the counter is reset and operated after the generation of the row active pulse and is stopped if the RAS time control signal is disabled.

11. A RAS time control circuit for use in a semiconductor memory device, comprising:
- a command decoder for decoding an external signal;
- a counter for counting the number of external clocks;
- a mode register for recording a comparison reference value set externally of the semiconductor memory device and a value added according to a kind of an input command;
- a comparator for comparing the counted clock number with a sum of the comparison reference value and the value added according to the kind of the command;
- a RAS controller for determining a delay time of an internal RAS signal from the comparison result of the comparator; and
- an internal RAS generator for maintaining an internal RAS signal according to an instruction of the RAS controller.

12. The RAS time control circuit as recited in claim 11, wherein the comparator outputs a comparison index whose level is changed when the counted clock number is identical to the sum;
- the RAS controller outputs a RAS time control signal disabled according to a transition of the comparison index; and
- the internal RAS generator maintains the internal RAS signal during an activation period of the RAS time control signal.

13. The RAS time control circuit as recited in claim 12, further comprising a command decoder for decoding an external signal and generating a row active pulse when if the decoded signal is determined as a command to activate the internal RAS signal, wherein the RAS time control signal is enabled in response to the row active pulse.

14. The RAS time control signal as recited in claim 13, wherein the counter is reset and operated after the generation of the row active pulse and is stopped if the RAS time control signal is disabled.

15. A RAS time control circuit for use in a semiconductor memory device, comprising:
- a command decoder for decoding an external signal;
- a counter for counting the number of external clocks;
- a comparator for comparing the counted clock number with a sum of a preset comparison reference value and a value added according to a kind of an inputted command;
- a RAS controller for determining a delay time of an internal RAS signal from the comparison result of the comparator;
- an internal RAS generator for maintaining an internal RAS signal according to an instruction of the RAS controller; and
- a legacy delay part for determining a delay time of the internal RAS signal when the decoded signal is a self refresh.

16. The RAS time control circuit as recited in claim 15, further comprising a mode register for recording the comparison reference value set from an outside of the semiconductor memory device and the value added according to the kind of the command.

17. The RAS time control circuit as recited in claim 15, further comprising a switching part for causing the legacy delay part to control the maintaining time of the internal RAS signal in a self refresh and causing the RAS controller to control the maintaining time of the internal RAS signal in a refresh except the self refresh.

18. The RAS time control circuit as recited in claim 17, wherein the comparator outputs a comparison index whose level is changed when the counted clock number is identical to the sum;
- the RAS controller outputs a RAS time control signal disabled according to a transition of the comparison index; and
- the internal RAS generator maintains the internal RAS signal during an activation period of the RAS time control signal.

19. The RAS time control circuit as recited in claim 18, wherein the command decoder generates a row active pulse when the decoded signal is determined as a command to activate the internal RAS signal, and the RAS time control signal is enabled in response to the row active pulse.

20. The RAS time control signal as recited in claim 19, wherein the counter is reset and operated after the generation of the row active pulse and is stopped if the RAS time control signal is disabled.

21. A RAS time control method of a semiconductor memory device including a counter for counting the number of external clocks and a comparator, the method comprising the steps of:
   S10) receiving a refresh command from an exterior;
   S20) resetting and operating the counter and enabling an internal RAS signal in response to the refresh command;
   S40) determining whether or not a predetermined time elapses by using a clock number inputted from the counter; and
   S60) if the predetermined time elapses, disabling the internal RAS signal and stopping an operation of the counter.

22. A RAS time control method of a semiconductor memory device including a command decoder, a counter for counting the number of external clocks, a comparator, and a RAS controller for controlling a RAS time control signal to control an internal RAS signal, the method comprising the steps of:
   S110) decoding an external command at the command decoder;
   S120) generating a row active pulse to the counter and the RAS controller at the command decoder;
   S130) resetting and operating the counter and enabling the RAS time control signal;
   S150) comparing the counted clock number with a preset comparison reference value;
   S160) if the counted clock number is identical to the preset comparison reference value, indicating an elapse of a delay time by using a comparison index; and
   S170) disabling the RAS time control signal according to the indication of the comparison index and stopping an operation of the counter.

23. The method as recited in claim 22, wherein the step S150 includes the steps of:
   S152) receiving the counted clock number at the comparator;
   S154) comparing whether or not the counted clock number is identical to the comparison reference value; and
   S156) if the counted clock number is not identical to the comparison reference value, returning to the step S152 to receive a next clock number.

24. The method as recited in claim 22, further comprising the steps of:
   S220) receiving an internal RAS signal enabled in response to the RAS time control signal in the step S130 at a legacy delay part;
   S230) outputting a delay completion signal after a predetermined time elapses from an enable time point of the internal RAS signal; and
   S240) disabling the RAS time control signal,
   wherein if the decoded command is a self refresh, the RAS time control signal is controlled through the steps S220 to S240; and
   if the decoded command is not the self refresh, the RAS time control signal is controlled through the steps S130 to S180.

25. A RAS time control method of a semiconductor memory device including a command decoder, a counter for counting the number of external clocks, a comparator, and a RAS controller for controlling a RAS time control signal to control an internal RAS signal, the method comprising the steps of:
   S310) decoding an external command at the command decoder;
   S315) storing the decoded command;
   S320) generating a row active pulse to the counter and the RAS controller at the command decoder;
   S330) resetting and operating the counter and enabling the RAS time control signal;
   S350) comparing the counted clock number with a sum of a preset comparison reference value and an added value according to the command;
   S360) if the counted clock number is identical to the sum, indicating an elapse of a delay time by using a comparison index; and
   S370) disabling the RAS time control signal according to the indication of the comparison index and stopping an operation of the counter.

26. The method as recited in claim 25, wherein the step S350 includes the steps of:
   S352) receiving the counted clock number at the comparator;
   S353) calculating an added value with respect to the recorded commands in the step S315 and summing the added value and the comparison reference value;
   S354) comparing whether or not the counted clock number is identical to the resulting sum; and
   S355) if the counted clock number is not identical to the resulting sum, returning to the step S352 to receive a next clock number.

27. The method as recited in claim 25, further comprising the steps of:
   S420) receiving an internal RAS signal enabled in response to the RAS time control signal in the step S330 at a legacy delay part;
   S430) outputting a delay completion signal after a predetermined time elapses from an enable time point of the internal RAS signal; and
   S440) disabling the RAS time control signal,
   wherein if the decoded command is a self refresh, the RAS time control signal is controlled through the steps S420 to S440; and
   if the decoded command is not the self refresh, the RAS time control signal is controlled through the steps S330 to S370.

* * * * *